United States Patent [19]

Ishihara et al.

[11] Patent Number: 4,527,182
[45] Date of Patent: Jul. 2, 1985

[54] SEMICONDUCTOR PHOTOELECTRIC CONVERTER MAKING EXCESSIVE CHARGES FLOW VERTICALLY

[75] Inventors: Yasuo Ishihara; Eiji Oda; Nobukazu Teranishi, all of Tokyo, Japan

[73] Assignee: Nippon Electric Co., Ltd., Tokyo, Japan

[21] Appl. No.: 304,301

[22] Filed: Sep. 21, 1981

[30] Foreign Application Priority Data

Sep. 19, 1980 [JP] Japan .................... 55-130517
Apr. 17, 1981 [JP] Japan .................... 56-57998

[51] Int. Cl.³ .......................................... H01L 29/78
[52] U.S. Cl. .......................................... 357/24; 357/30; 357/52
[58] Field of Search ................. 357/24 LR, 24, 30, 52

[56] References Cited

U.S. PATENT DOCUMENTS 4,148,048 4/1979 Takemoto et al. ............. 357/24 X
4,206,371 6/1980 Weimer ........................... 357/30 X
4,373,167 2/1983 Yamada ......................... 357/24 LR

OTHER PUBLICATIONS

Chamberlain, S. G., "High Speed Scanner Photoelement with Gain", *IBM Tech. Discl. Bull.*, vol. 19, No. 11, pp. 4458-4459, Apr. 1977.

*Primary Examiner*—Andrew J. James
*Assistant Examiner*—William A. Mintel
*Attorney, Agent, or Firm*—Laff, Whitesel, Conte & Saret

[57] ABSTRACT

A semiconductor imager comprises a first and a second region (41, 42) which have a conductivity type opposite to a substrate (21) and are reverse biassed relative to the substrate beneath photosensitive regions (22) of each row and a reading device (26, 33) for the row, respectively, to be completely and not to be completely depleted, respectively. The imager may or may not comprise such a covering region (77) on each photosensitive region as may have the conductivity type of the first and the second regions and be not completely depleted. It is possible to provide a line sensor or a photodiode of a similar structure. Preferably, the first and the second regions have a common impurity concentration lower than the photosensitive regions and are respectively thinner and thicker relative to each other. The covering region preferably has the impurity concentration of each channel stopper (23).

12 Claims, 18 Drawing Figures

SEMICONDUCTOR PHOTOELECTRIC CONVERTER MAKING EXCESSIVE CHARGES FLOW VERTICALLY

BACKGROUND OF THE INVENTION

This invention relates to a solid-state or semiconductor photoelectric converter. The photoelectric converter may be a photodiode, a line sensor, or an image pickup device.

A solid-state image pickup device is generally of the charge transfer type as named in the art, and is developed either according to a frame transfer scheme or an interline transfer scheme. As will later be described in detail with reference to more than a dozen figures of the accompanying drawing, an image pickup device of the type described, has a principal surface and includes a two-dimensional array of photosensitive semiconductor regions contiguous to the principal surface in rows and columns for converting an optical image projected onto the principal suface to a pattern of electrical signals. The principal surface, as herein called, of the image pickup device will become clear as the description proceeds. The image pickup device further includes reading devices for the respective columns of photosensitive semiconductor regions along the principal surface for reading the electrical signals, and a semiconductor substrate contiguous to the photosensitive semiconductor regions and the reading devices in juxtaposition with the principal surface.

Generally, the photosensitive semiconductor regions are given a conductivity type of the semiconductor substrate and a higher impurity concentration. In this context, the semiconductor substrate, as herein named, is a bulk of a semiconductor wafer that does not comprise the photosensitive semiconductor regions and the reading devices.

Such image pickup devices are compact, light in weight, low in power consumption, and highly reliable like other solid-state devices and are in rapid progress. An image pickup device of the charge transfer type is additionally advantageous as regards noise, afterimages or residual images, scorching, and others, as compared with an image pickup or camera tube now in use. The image pickup device has, however, had serious problems of blooming and smear phenomena. The smear phenomenon is a sort of crosstalk among electrical signals of the pattern.

A line sensor comprises only one of the columns of photosensitive semiconductor regions and a reading device therefor. The column may be called a row depending on the circumstances. The photosensitive semiconductor regions in such a row are responsive to a linear optical image and are for producing a linearly distributed electrical signals. It is possible to understand that the array of photosensitive semiconductor regions of a solid-state image pickup device comprises such an elementary row of photosensitive semiconductor regions and additional rows. The line sensor has the problems of blooming and smear phenomena.

A photodiode may comprise only one photosensitive semiconductor region and need not comprise a reading device therefor. The photosensitive semiconductor region will be called a unit photosensitive semiconductor region and is responsive to a picture element of the optical image. An elementary electrical signal produced by the unit photosensitive semiconductor region is related to a quantity of light at the picture element. It is possible to understand that each row of photosensitive semiconductor regions described hereinabove, comprises such a unit photosensitive semiconductor region and additional photosensitive semiconductor regions. The photodiode has the problem of blooming. A photodiode comprising a plurality of individual photosensitive semiconductor regions additionally has the problem of smear phenomenon.

SUMMARY OF THE INVENTION

It is therefore a principal object of the present invention to provide a solid-state photoelectric converter, in which blooming is avoided.

It is a subordinate object of this invention to provide a solid-state photoelectric converter of the type described, in which smear phenomenon is suppressed.

It is another subordinate object of this invention to provide a solid-state photoelectric converter of the type described, with which it is possible to increase the light accumulating capacity of a photosensitive semiconductor region and to reduce the dark current.

A solid-state photoelectric converter to which this invention is applicable, has a principal surface and includes a semiconductor substrate of a first conductivity type in juxtaposition with the principal surface and a unit photosensitive semiconductor region of the first conductivity type contiguous to the principal surface for converting a quantity of light projected onto the principal surface to an elementary electrical signal related to the quantity. According to this invention, the above-specified solid-state photoelectric converter comprises an interposed semiconductor region of a second conductivity type opposite to the first conductivity type contiguous to the photosensitive semiconductor region and forming an elementary junction with the substrate and biassing means for reverse biassing the junction to substantially completely deplete the interposed semiconductor region.

A solid-state photoelectric converter according to this invention may or may not comprise a covering semiconductor region of the first conductivity type covering the photosensitive semiconductor region with a portion of the principal surface interposed. Preferably, an electrical potential is supplied to the covering semiconductor region so as not to completely deplete the covering semiconductor region.

A solid-state photoelectric converter to which an aspect of this invention is applicable, includes additional photosensitive semiconductor regions of the first conductivity type contiguous to the principal surface in an elementary row including the unit photosensitive semiconductor region for converting a linear optical image projected onto the principal surface to elemental linearly distributed electrical signals representative of the optical image and elementary reading means along the principal surface in juxtaposition with the row for reading the electrical signals. The linearly distributed electrical signals include the elementary electrical signal. According to this aspect of this invention, the above-specified solid-state photoelectric converter comprises a first and a second unit semiconductor region of the second conductivity type contiguous to the photosensitive semiconductor regions of the row and the reading means, respectively, and forming a first and a second unit junction with the substrate, respectively. The first unit semiconductor region includes the interposed semiconductor region. The first unit junction includes the elementary junction. The biassing means is for reverse biassing the first and the second unit junctions to substantially completely and not to completely deplete the first and the second unit semiconductor regions, respectively.

A solid-state photoelectric converter to which another aspect of this invention is applicable, includes further photosensitive semiconductor regions of the first conductivity type contiguous to the principal surface in additional rows juxtaposed to the elementary row for converting additional linear optical images projected onto the principal surface to additional linearly distributed electrical signals representative of the additional linear optical images, respectively, and additional reading means along the principal surface in juxtaposition with the respective additional rows for reading the additional linearly distributed electrical signals, respectively. According to the latter aspect of this invention, the above-specified solid-state photoelectric converter comprises a first and a second additional semiconductor region of the second conductivity type contiguous to the photosensitive semiconductor regions of each of the additional rows and each of the additional reading means, respectively, and forming a first and a second additional junction with the substrate, respectively. The first and the second additional junctions are reverse biased by the biassing means to substantially completely and not to completely deplete the first and the second additional semiconductor regions, respectively.

DESCRIPTION OF THE PREFERRED EMBODIMENTS

Figure 1:
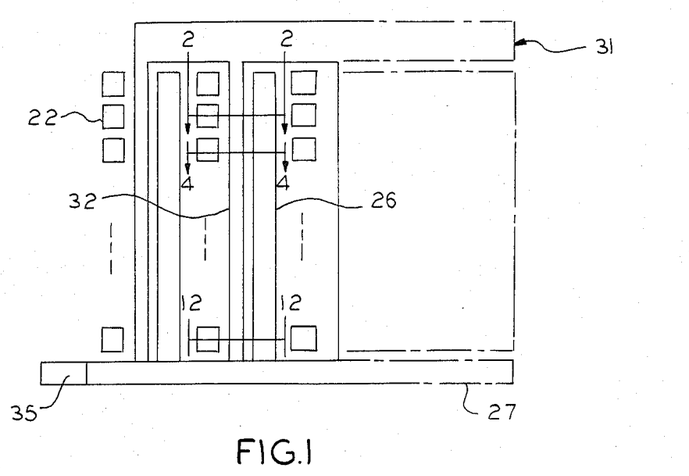
FIG. 1 is a schematic top view of a solid-state image pickup device according to an interline charge transfer type, to which the instant invention is applicable.
Figure 2:
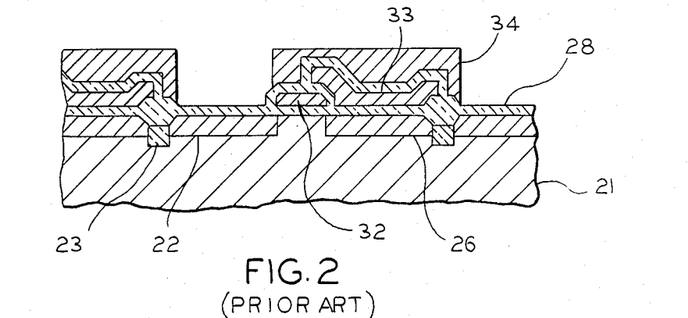
FIG. 2 is a diagrammatical sectional view taken along line 2—2 of FIG. 1 for a conventional solid-state image pickup device.

Referring to FIGS. 1 and 2, a conventional solid-state image pickup device will be described for a better understanding of the present invention before proceeding to description of several preferred embodiments of this invention with reference to about a dozen of figures of the accompanying drawing. The image pickup device is according to the interline charge transfer scheme known in the art. During manufacture, a semiconductor wafer has an exposed surface. The wafer provides a semiconductor substrate 21 of a predetermined conductivity type and a preselected impurity concentration. Merely for brevity of description, it will be assumed throughout the following description that the substrate 21 is of the p-type conductivity and of a relatively low impurity concentration.

A two-dimensional array of very heavily doped regions 22 of the n-type conductivity is formed in the wafer along the exposed surface in rows and columns. The heavily doped regions 22 are for serving as photosensitive semiconductor regions and will be so referred to for clarity of description.

Channel stoppers or stops 23 of the p+-type conductivity are formed along the columns to define semiconductor stripes therebetween at least adjacent to the exposed surface of the wafer. The photosensitive regions 22 of each column are contiguous to one of the channel stoppers 23 and are electrically isolated from one another by branches (not shown) of that channel stopper 23. A column of spaces is left between such photosensitive regions 22 and the adjacent one of the channel stoppers 23 that defines one of the semiconductor stripes in cooperation with the channel stopper 23 in question.

Columns of considerably highly doped regions 26 of the n-type conductivity are formed in the respective semiconductor stripes contiguous to the exposed surface and to the adjacent channel stoppers 23 with a gap left between the highly doped region 26 formed in each semiconductor stripe and the photosensitive regions 22 in the semiconductor stripe under consideration. As will presently become clear, such a highly doped region 26 provides a column charge transfer region of a buried charge-coupled device that serves as a column or vertical charge transfer shift register. For simplicity of description, the highly doped region 26 will often be called a "column shift register". Column shift registers formed in and adjacent to a semiconductor stripe in which the photosensitive regions 22 in question will be referred to as an "associated shift register" and an "adjacent shift register", respectively.

The exposed surface provides a principal surface, as named herein, of the image pickup device. A charge transfer row or horizontal shift register 27 is likewise formed so as to cooperate with all column shift registers 26. The principal surface is covered with an insulating layer 28. A charge transfer control gate 31 is formed on the insulating layer 28 with leg electrodes 32 thereof laid above the respective gaps in the semiconductor stripes. An n-type channel region is formed across a gap of the semiconductor stripe between each photosensitive region 22 and an associated shift register 26. Charge transfer electrodes 33 of the column shift registers 26 are formed on the insulating layer 28 in rows and columns. Columns of the charge transfer electrodes 33 are above the respective column charge transfer regions 26. Rows of the charge transfer electrodes 33 are aligned with the respective rows of photosensitive regions 22. Each row of the charge transfer electrodes 33 are connected to a conductor (not shown). Preferably, the conductors for the respective rows of charge transfer electrodes 33 are extended on the insulating layer 28 along the respective branches of the channel stoppers 23. The column shift registers therefore have buried n-channels.

As best shown in FIG. 2, another layer of an insulating material should be interposed between the leg electrodes 32 and the conductors for the charge transfer electrodes 33. A layer 34 for substantially cutting off the light incident on or projected onto the image pickup device is formed on the electrodes 32 and 33 and the conductors. When the layer 34 is conductive, still another insulating layer should be interposed between the layer 34 and the electrodes 32 and 33 and the conductors. It will be presumed that the layer 34 is a metal layer and will be so referred to. A signal detector 35 known in the art (FIG. 1) is connected to one of charge transfer electrodes (not shown) of the row shift register 27. The metal layer 34 has windows only above the photosensitive regions 22 to provide optical apertures therefor.

When an optical image is projected onto the image pickup device usually through an optical system (not shown), signal charges are accumulated in the respective photosensitive regions 22 in a pattern in relation to the quantity of light incident onto the principal surface through the insulating layer 28 at the apertures. The transfer control gate 31 is supplied with a periodic control signal that substantially rectangularly varies with time between a high and a low level. Under the control by the transfer control gate 31, signal charges of a set accumulated in the respective photosensitive regions 22 during each period of the control signal are transferred to the associated shift register 26. The transfer control gate 31 is thereafter closed by the control signal for storage of signal charges of another set during the next succeeding period. During each period, the signal charges transferred to the respective column shift registers 26 are simultaneously shifted stage by stage or row by row towards the row shift register 27. In the meanwhile, the signal charges transferred from the column shift register stages along a row to the row shift register 27, are shifted therein towards the signal detector 35 and taken out therefrom as on output signal.

Figures 3A, 3B:
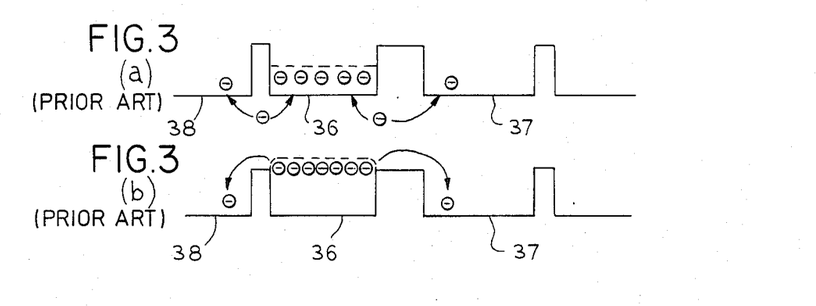
FIG. 3 shows a potential distribution in a semiconductor substate depicted in FIG. 2.

Turning to FIG. 3, a thick line depicted at (a) represents an electrical potential distribution along a straight line passing through one of the photosensitive regions 22, the channel region aligned with the photosensitive region 22 under consideration, and the associated shift register 26, with the electrical potential at the channel stoppers 23 assumed as a reference or zero potential. A potential well 36 is formed for the signal charges (electrons) at the photosensitive region 22. Signal charges produced along an interface between the photosensitive region 22 and the channel region therefor, flow partly into the potential well 36 and partly into an associated potential well 37 of the associated shift register 26. Those produced along another interface towards the adjacent channel stopper 23 contiguous to the adjacent shift register 26, flow partly into the potential well 36 of the photosensitive region 22 and partly into an adjacent potential well 38 of the adjacent shift register 26.

The rays of the optical image may obliquely be incident onto the principal surface of the image pickup device. The leg electrodes 32 and the charge transfer electrodes 33 may be made of polycrystalline silicon. Under the circumstances, the rays are subjected to multiple reflection and propagated along the principal surface to produce spurious charges in the associated and the adjacent potential wells 37 and 38. Usually, the insulating layer 28 also contributes to the multiple reflection.

Such phenomena may occur even during transfer of signal charges from the photosensitive regions 22 to the associated shift registers 26 and during shift of the charges along the respective column shift registers 26. As a result, the signal charges being transferred and shifted are accompanied by leakage charges. The intensity of light of the optical image is usually different from picture element to picture element. The quantity of light projected onto the principal surface is accordingly different from column to column as well as from row to row. The average quantities along the respective columns of the photosensitive regions 22 therefore result in different dark currents. This gives rise to the smear phenomenon mentioned hereinabove.

Further referring to FIG. 3, excess signal charges may fill, as depicted at (b), the potential well 36 of the photosensitive region 22 illuminated by a strong light. The excess charges will overflow from the potential well 36 to the associated and the adjacent potential wells 37 and 38. This results in the blooming phenomena described heretobefore and appears as a bright line on a picture reproduced from the output signal.

Figure 4:
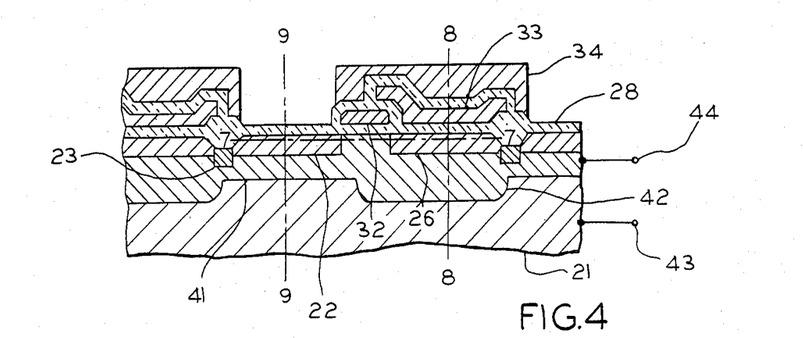
FIG. 4 is a diagrammatical sectional view taken along line 4—4 of FIG. 1 for a solid-state image pickup device according to a first embodiment of this invention.

Referring back to FIG. 1 and afresh to FIG. 4, an n-channel solid-state image pickup device according to a first embodiment of this invention comprises similar parts designated by like reference numerals. The semiconductor substrate 21 may have a relatively low N-type impurity concentration selected between $10^{13}$ and $10^{17}$ atoms per cubic centimeter. As described above, the photosensitive regions 22 are very highly doped n-type regions of an impurity concentration selected between $10^{15}$ and $10^{20}$ atoms per cubic centimeter and are manufactured by the use of a dose selected between $10^{11}$ and $10^{14}$ atoms per square centimeter as will be described hereunder. The depth of a junction defining each photosensitive region 22 may be selected between 0.1 and 10 microns. The channel stoppers 23 have a $p^+$-type impurity concentration above $10^{15}$ atoms per cubic centimeter. The charge transfer regions 26 of the respective column shift registers are n-type regions of a considerably high impurity concentration selected between $10^{15}$ and $10^{17}$ atoms per cubic centimeter with a depth selected between 0.1 and 10 microns. The insulating layer 28 is preferably made of silicon dioxide and has a thickness selected between 0.1 micron and 2 microns at the optical apertures. Besides polycrystalline silicon, the leg electrodes 32 of the charge transfer control gate 31 and the charge transfer electrodes 33 of the column shift registers 26 may be made of aluminium, molybdenum, tungsten, and other metals. The metal layer 34 may be made of any one of the metals exemplified for the electrodes 32 and 33. Alternatively, the layer 34 may be made of an organic substance capable of substantially cutting the light off.

Referring more specifically to FIG. 4, the image pickup device comprises a p-type region. On one side, the p-type region is contiguous to the photosensitive regions 22, the channel stoppers 23, and the column shift registers 26 and reaches the insulating layer 28 at the gaps in the respective semiconductor stripes. On the other side, the p-type region is contiguous to the semiconductor substrate 21 to form a p-n junction with the substrate 21. The channel stoppers 23 may extend through the p-type region to reach the substrate 21 together with the branches thereof. It is now understood that the semiconductor substrate 21, as herein called, is juxtaposed to the photosensitive regions 22 and the column shift registers 26 and that the column shift registers 26 serve in cooperation with the row shift register 27 (FIG. 1) and others, such as means (not shown) for producing the shift pulses for the shift registers 26 and 27, as means for reading the signal charges from the respective photosensitive regions 22 as an electrical signal representative of an optical image projected onto the principal surface of the image pickup device.

The p-type region may have a relatively low uniform impurity concentration selected between $10^{14}$ and $10^{16}$ atoms per cubic centimeter. The p-type or $p^-$-type region comprises first and second semiconductor regions 41 and 42 in each semiconductor stripes. The first and the second regions 41 and 42 are contiguous to the photosensitive regions 22 and the column shift register 26, respectively. Each first region 41 may have a first junction depth and a width selected between 1 and 20 microns and between 2 and 40 microns, respectively. Each second region 42 may have a second junction depth and a width selected between 1 and 100 microns and also between 1 and 100 microns, respectively. It is important that the first and the second junction depths be shallower and deeper relative to each other when the regions 41 and 42 have the same or nearly same impurity concentration. Under the circumstances, the first and the second regions 41 and 42 form first and second junctions with the semiconductor substrate 21 nearer to the principal surface of the image pickup device and farther therfrom, respectively.

Reference and biassing electrodes 43 and 44 are brought into ohmic contact with the semiconductor substrate 21 and the p-type region 41 plus 42, respectively. The biassing electrode 44 may alternatively be brought into ohmic contact with the channel stoppers 23. The first and the second junctions are reverse biassed with the reference and the biassing electrodes 43 and 44 supplied with a reverse bias voltage, which may simply be called a substrate voltage. A voltage between 1 and 30 volts may be selected as the reverse bias voltage. It is important that the impurity concentrations in the first and the second regions 41 and 42, the first and the second junction depths, and the reverse bias voltage be selected so that the first and the second regions 41 and 42 be substantially completely and be not completely depleted, respectively.

Basic operation is not much different from that described in conjunction with the conventional image pickup device. Function of the first and the second regions 41 and 42 will later become clear.

Figure 5:
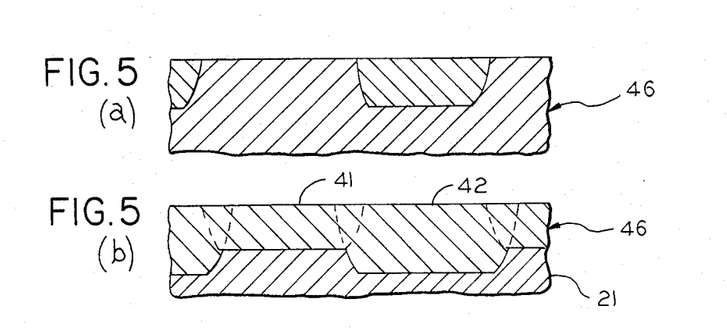
FIG. 5 shows exploded sectional views for use in describing a method of manufacturing the image pickup device illustrated in FIG. 4.

Referring to FIG. 5 for a short while, a method of manufacturing the image pickup device illustrated with reference to FIGS. 1 and 4 includes the steps depicted at (a) and (b). As shown at (a), those regions of an n-type semiconductor wafer 46 which correspond to the second regions 42, are doped with a p-type impurity in the first step of manufacture by using the known photoetching technique and resorting either to ion implantation or thermal diffusion. The impurity is redistribution diffused by a heat treatment process either in an inert gas or an atmosphere of a low oxygen content. As depicted at (b), either the same or another p-type impurity is selectively diffused into regions corresponding to the first regions 41 by repeating the photoetching technique. By a similar heat treatment process, the semiconductor substrate 21 and the first and the second regions 41 and 42 are formed as desired. Thereafter, the photosensitive regions 22, the channel stoppers 23, the column and the row shift registers 26 and 27, and others are formed. The p-type impurity may be selected from boron, antimony, and like substances. The heat treatment may be carried out at a temperature between 1000° and 1200° C. for a duration between 0.5 and 20 hours.

Figure 6:
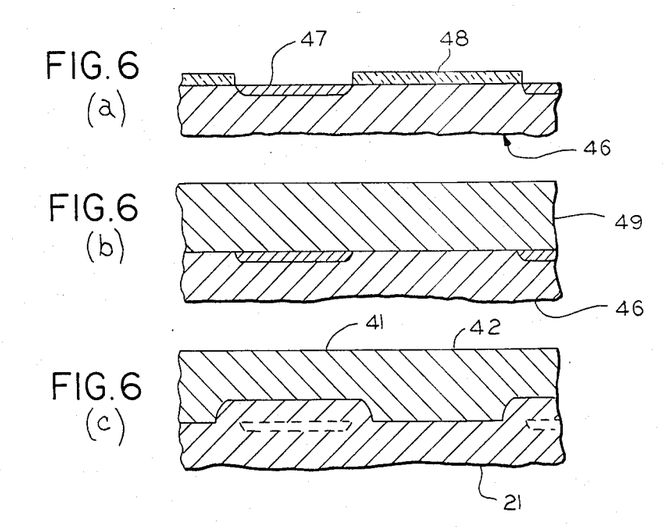
FIG. 6 shows exploded sectional views for describing another method of manufacturing the image pickup device depicted in FIG. 4.

Turning to FIG. 6, another method of manufacturing the image pickup device includes the steps illustrated at (a), (b), and (c). As depicted at (a), a wafer 46 is doped with an n-type impurity by the use of the photoetching technique at regions 47 which will lie below bottom portions of the respective first regions 41 and are not covered with mask portions 48. The n-type impurity may be any one of phosphorus, arsenic, and other materials. The n-type regions 47 may have a very high impurity concentration selected between $10^{15}$ and $10^{20}$ atoms per cubic centimeter and a depth between 0.1 and 10 microns.

As illustrated in FIG. 6 at (b), the mask portions 48 are removed to expose the wafer surface. Subsequently, a layer 49 of a p-type semiconductor material is formed on the n-type regions 47 and the exposed surface areas of the wafer 46 by, for example, the vapor-phase growth technique. The p-type semiconductor layer 49 may have an impurity concentration and a thickness of the second regions 42.

As shown in FIG. 6 at (c), the n-type impurity of the regions 47 is diffused into the wafer 46 and the p-type semiconductor layer 49 by heat treatment, which may be carried out at a temperature between 1000° and 1200° C. for a duration between 0.5 and 20 hours. Primarily due to the difference in the impurity concentrations at the wafer 46, the n-type region 47, and the p-type semiconductor layer 49, the semiconductor substrate 21 and the first and the second regions 41 and 42 are obtained as desired.

Figure 7:
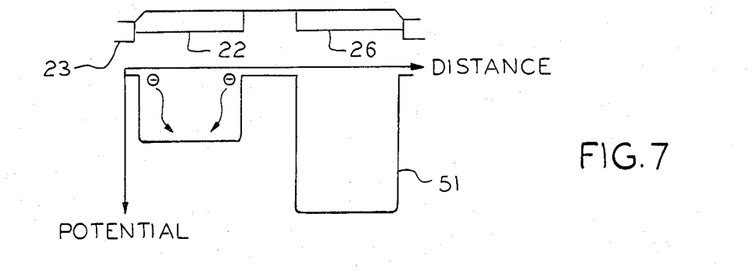
FIG. 7 shows a potential distribution along a horizontal line 7—7 drawn in FIG. 4, together with several structural elements therein illustrated.

Temporarily referring to FIG. 7, the abscissa represents a distance along the line 7—7 in FIG. 4 from one of the channel stoppers 23 and the ordinate, an electrical potential with the potential at the channel stoppers 23 regarded as a reference potential of zero volt. The reverse bias voltage gives a junction between each photosensitive region 22 and the first region 41 contiguous thereto an electric potential higher than the potentials under the charge transfer control gate 31 and accordingly under the leg electrode 32 and under the channel stoppers 23 and the branches thereof as exemplified by a curve 51.

Figure 8:
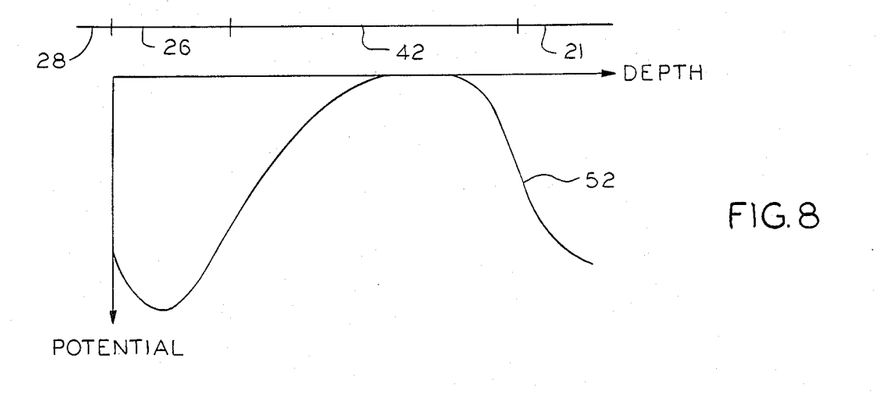
FIG. 8 likewise shows a potential distribution along a vertical line 8—8 depicted in FIG. 4.

Turning to FIG. 8, the abscissa shows the depth from the principal surface of the image pickup device and the ordinate, the electrical potential as in FIG. 7. A curve 52 shows a potential distribution when a charge transfer electrode 33 aligned with the photosensitive region 22 under consideration is given a high level shift pulse. No signal charges are present in that portion of the column shift register 26 which lies under the charge transfer electrode 33 in question. As described before, each second region 42 is not completely depleted. Even if depleted to a certain extent, the second region 42 should be given a potential such that junctions between the second region 42 and the column shift register 26 and between the second region 42 and the semiconductor substrate 21 are never forwardly biassed.

Figure 9:
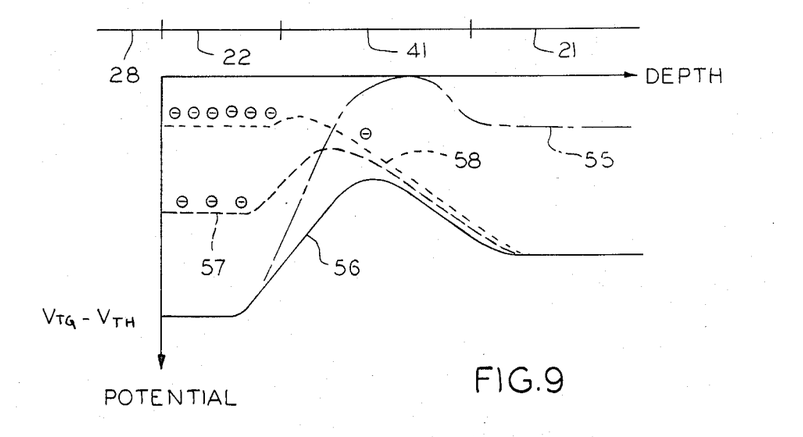
FIG. 9 is a similar representation of a few potential distributions along another vertical line 9—9 drawn in FIG. 4.

Referring now to FIG. 9, the abscissa and the ordinate are representative of the depth and the electrical potential as in FIG. 8. The potential distribution is as illustrated by a dash-dot-line curve 55 when the reverse bias voltage is low. Each photosensitive region 22 is set at an electrical potential equal to $V_{TG} - V_{TH}$, where $V_{TG}$ represents the potential given to the charge transfer control gate 31 and accordingly to the adjacent leg electrode 33 to switch the gate 31 conductive and $V_{TH}$, the threshold voltage of the transfer gate 31.

When the reverse bias voltage is rendered optimum to completely deplete the contiguous first region 41, the potential distribution varies to that illustrated by a full-line curve 56. As the signal charges are accumulated in the photosensitive region 22, the potential distribution further varies as exemplified by a dash-line curve 57 and eventually to that depicted by a dotted-line curve 58. With the potential distribution of the dotted-line curve 58, the junction between the photosensitive region 22 and the contiguous first region 41 is nearly forwardly biassed. Excess signal charges that may be accumulated in the potential well 36 (FIG. 3) for the photosensitive region 22 in question, flow to the semiconductor substrate 21 through the interposed first region 41 as indicated by arrows. The excess charges, if any, are thus entirely swept away from the potential well 36 to the substrate 21 as a punch-through current. With this, it is possible to completely suppress the blooming phenomenon. The effect has been confirmed by experiments.

Referring again to FIGS. 7 and 8, the potential at the photosensitive region 22 is higher as described before than those at the surroundings. The contiguous first region 41 is completely depleted so as to have a surrounding barrier shown in FIG. 7 between that first region 41 and the associated and the adjacent shift registers 26 at any depth. Spurious charges produced at the boundary therefore flow into the potential well 36 for that photosensitive region 22. This suppresses diffusion or leakage of the signal charges and the resulting smear phenomenon.

Figure 10:
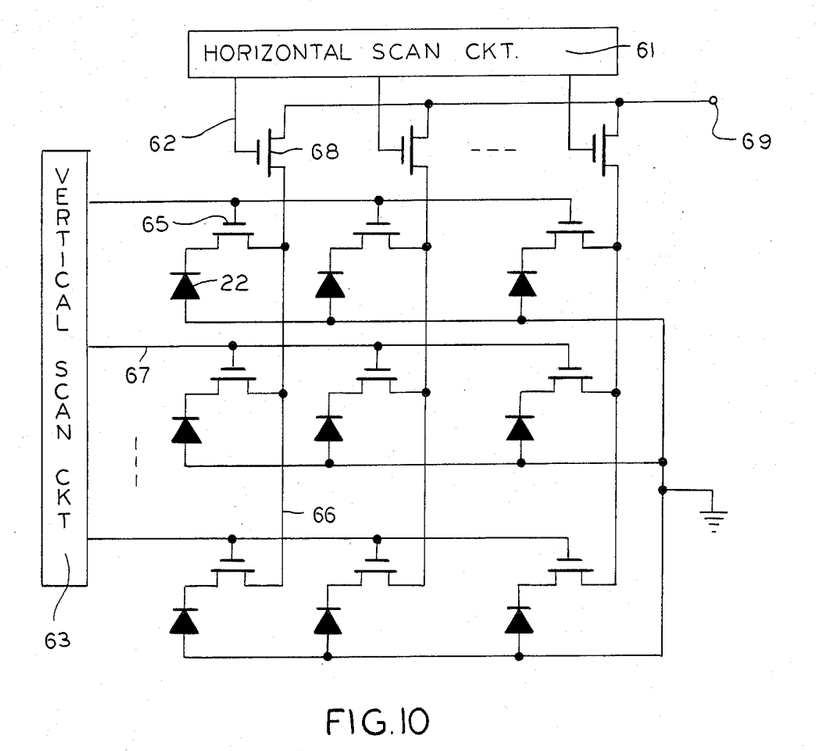
FIG. 10 shows, partly in blocks, a solid-state image pickup device which is of the MOS sensor type as called in the art and to which this invention is applicable.
Figure 11:
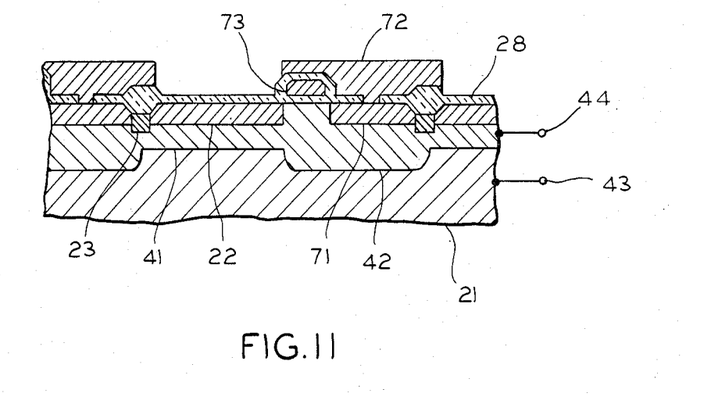
FIG. 11 is a schematic sectional view corresponding to FIG. 4, of a solid-state image pickup device according to a second embodiment of this invention.

Referring now to FIGS. 10 and 11, an n-channel solid-state image pickup device according to a second embodiment of this invention is of the MOS sensor type as called in the art. Similar parts are designated again by like reference numerals. A horizontal scan circuit 61 is for supplying horizontal scan taps 62 with horizontal scan pulses successively once during each horizontal scan period. A vertical scan circuit 63 is for cyclically supplying vertical scan taps with vertical scan pulses either in the interlaced manner or in the frame sequential manner known in the television art with each vertical scan pulse kept during the horizontal scan period. The photosensitive regions 22 are connected to source electrodes of element readout switching MOS transistors 65, respectively. Drain electrodes of the MOS transistors 65 for the photosensitive regions 22 aligned along each column of the two-dimensional array, are connected to one of column conductors 66 that is provided for that column of the array. Likewise, gate electrodes of the MOS transistors 65 for the photosensitive regions 22 arranged along each row, are connected to one of row conductors 67 connected to the respective vertical scan taps of the vertical scan circuit 63. The column conductors 66 are connected to source electrodes of line readout switching MOS transistors 68, respectively, which have gate electrodes connected to the respective horizontal scan taps 62 and drain electrodes connected to a common output terminal 69.

When a certain one of the row conductors 67 is given a high level, the element readout switching MOS transistors 65 connected to that row conductor 67 are simultaneously rendered conductive. Signal charges accumulated in the photosensitive regions 22 connected to the conductive ones of the MOS transistors 65, are read out into the respective column conductors 66. The read-out signal charges are successively delivered to the output terminal 69 through the line readout switching MOS transistors 68.

If the image pickup device illustrated with reference to FIG. 10 were of the conventional structure and when a strong light falls on one or several of the photosensitive regions 22 coupled to a certain one of the column conductors 66, excessive signal charges produced in the photosensitive region or regions 22 is question, leak to that column conductor 66 as spurious charges. This results in the blooming phenomenon. Furthermore, spurious charges produced in the device regions other than the photosensitive regions 22 give rise to the smear phenomenon.

Referring more particularly to FIG. 11, each photosensitive region 22 serves as that source electrode of the element readout switching MOS transistor 65 which is connected thereto. The drain electrode of the MOS transistor 65 under consideration is provided by an n-type region 71, similar to the column charge transfer region 26 (FIG. 4 in particular) of the column charge transfer shift register which is aligned in the semiconductor stripe with the photosensitive region 22 in question. Such an n-type region 71 will therefore be referred to as a drain although the drains aligned along each column may or may not be a continuous n-type region. Each drain 71 may have an impurity concentration and a thickness selected between $10^{15}$ and $10^{20}$ atoms per cubic centimeter and between 0.1 and 10 microns, respectively. In other respects, regions formed below the principal surface of the image pickup device may have impurity concentrations and dimensions described in conjunction with FIGS. 1 and 4. The drains 71 provide n-channels for the charge transfer along the respective columns.

The column conductors 66 are preferably provided by the metal layer 34 (FIG. 4) divided into metal strips 72 rather than by conductor strips described in conjunction with FIG. 4 in particular as the charge transfer electrodes 33, which are now dispensed with. The drains, such as 71, of the element readout switching MOS transistors 65 arranged along each column, are connected to the metal strip 72 for that column through holes formed through the insulating layer 28. Conductor strips described as the leg electrodes 32 (FIG. 4) are neither continuous along the respective columns nor connected in common as the charge transfer gate 31 but are divided into metal pieces 73 arranged along the respective rows of photosensitive regions 22. The metal pieces 73 in each row are connected in common to one of the row conductors 67 for that row. The row conductors 67 are preferably laid on the insulating layer 28 above the respective branches of the channel stoppers 23. The metal pieces 73 serve as the gate electrodes of the respective element readout switching MOS transistors 65 together with channel regions thereunder in the p-type region 41 plus 42. Functions of the first and the second regions 41 and 42 and the technical merits thereby achieved are similar to those described before.

Figure 12:
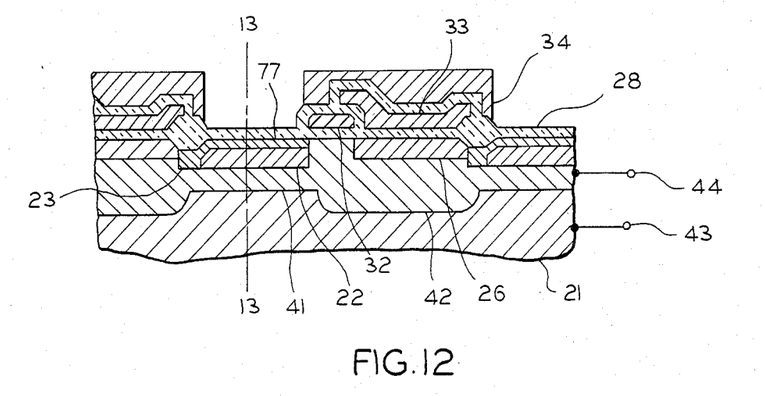
FIG. 12 is a schematic sectional view taken along line 12—12 of FIG. 1 for a solid-state image pickup device according to a third embodiment of this invention.

Referring now to FIG. 12, an n-channel solid-state image pickup device according to a third embodiment of this invention is similar in structure to the device illustrated with reference to FIGS. 1, 4, and others. Similar parts are designated by like reference numerals. A covering semiconductor region 77 of the p+-type conductivity is formed between each photosensitive region 22 and the insulating layer 28. The covering region 77 therefore lies between two adjacent branches of each channel stopper 23 and may be manufactured concurrently with the channel stopper 23 to have an impurity concentration and a thickness selected between $10^{15}$ and $10^{20}$ atoms per cubic centimeter and between 0.1 and 5 microns, respectively. It is preferred that the covering regions, such as 77, are electrically connected to the channel stoppers 23. It should now be understood that the principal surface, as herein called, of the image pickup device is provided on each photosensitive region 22 by an interface between that region 22 and the covering region 77. In other words, each covering region 77 covers a photosensitive region 22 with a portion of the principal surface interposed. Another interface between each covering region 77 and the insulating layer 28 may or may not be flush with other interfaces between the column charge transfer regions 26 and the insulating layer 28.

Referring back to FIGS. 7 and 8, the potential distributions are not much different in the device illustrated with reference to FIG. 12 insofar as the curves 51 and 52 are concerned.

Figure 13:
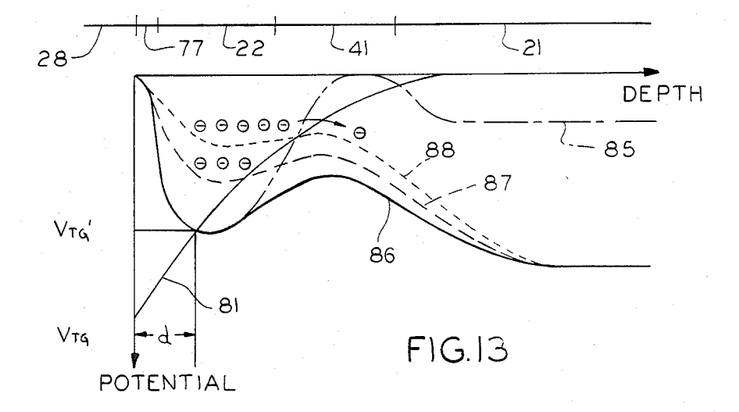
FIG. 13 shows several potential distributions primarily along a vertical line 13—13 drawn in FIG. 12, together with a schematic representation of a few structural elements therein depicted.

Turning to FIG. 13, the abscissa shows the depth from the interface between the covering region 77 and the insulating layer 28 and the ordinate, the electrical potential as is the case with FIGS. 7, 8, and 9. A monotonously varying full-line curve 81 shows a potential distribution under each leg electrode 32 of the charge transfer control gate 31 when the gate 31 is given the voltage $V_{TG}$ to be switched on. Inasmuch as the covering regions 77 are kept at the zero potential, curves 55 through 58 depicted in FIG. 9 become curves 85, 86, 87, and 88.

As shown by a common part of the curves 85 and 86, the photosensitive region 22 is set substantially at a potential $V_{TG}'$, which the p-type region 41 plus 42 has at a depth d under the leg electrode 32 when the control gate 31 is rendered on. At this instant, the photosensitive region 22, reverse biassed on both sides by the covering region 77 and the first region 41, is given a maximum potential along the line 13—13 drawn in FIG. 12. This is equivalent to an increase in the capacity of accumulating the signal charges in the photosensitive region 22. Insomuch as the impurity concentration is very high, the covering region 77 is not depleted. This gives rise to an additional contribution of suppressing dark currents resulting from surface recombination and of reducing the dark currents.

Figure 14:
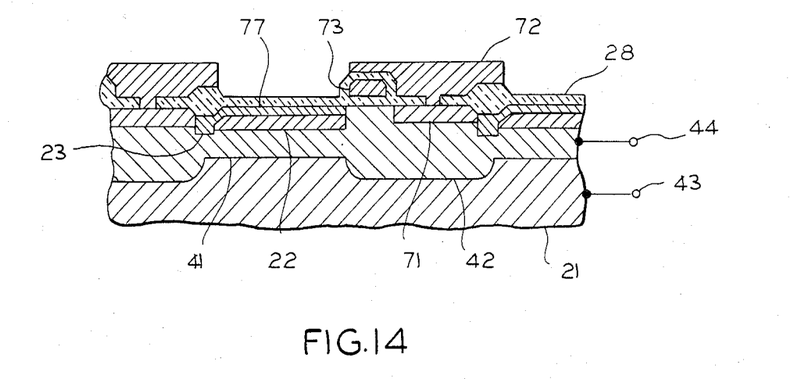
FIG. 14 is a diagrammatical sectional view, similar to FIG. 12, of a solid-state image pickup device according to a fourth embodiment of this invention.

Finally referring to FIG. 14, an n-channel solid-state image pickup device according to a fourth embodiment of this invention is similar to the device illustrated with reference to FIGS. 10 and 11. Similar parts are designated by like reference numerals. A covering region 77 is formed on each photosensitive region 22 as described in conjunction with FIG. 12. The device being illustrated has the technical advantages pointed out in conjunction with the devices illustrated hereinabove with reference to FIGS. 1 and 4 through 11 and FIGS. 10 and 11 and additional technical merits described in connection with the device illustrated with reference to FIGS. 12 and 13.

While this invention has thus far been described in conjunction with a few preferred embodiments thereof and several modifications, it will now be readily possible for one skilled in the art to carry this invention into effect in various other manners. For example, the photosensitive regions 22 used in the devices illustrated with reference to FIGS. 1 and 4 through 9 and FIGS. 12 and 13 may have the MOS structure. The column charge transfer regions 26 may not necessarily be formed as buried channels but as surface channels. At any rate, the reading means are formed along the principal surface of the imgage pickup device. The junctions between the photosensitive region 22 and the contiguous first region 41 and between the buried column charge transfer region 26 and the contiguous second region 42 need not be coplanar. The principal surface may have shallow indents at some of the photosensitive regions 22 in order to cope with optical and/or chromatic aberrations of the optical system for the optical image. Each leg electrode 32 and the adjacent column charge transfer electrode 33 may be formed as a single electrode when p-type channel regions are formed in the p−-type region 41 plus 42 along the gap. An image pickup device according to this invention may be a p-channel device rather than an n-channel devive. In this event, the conductivity types of the respective regions, such as 21, 22, 23, 26, 41, 42, 47, 49, and 77, should be reversed. The first region 41 may be as thin as 0.5 micron. The reverse bias voltage may be as high as 100 volts. A predetermined and a prescribed reverse bias voltage may separately be supplied to the first and the second regions 41 and 42, respectively, by the use of separate biassing electrodes or terminals similar to the electrode 44.

This invention is applicable to a line sensor and a photodiode. As described heretobefore, a line sensor comprises photosensitive regions 22 aligned only along a column, which may be called a row. In this event, the first and the second semiconductor regions 41 and 42 may be called first and second unit semiconductor regions. The first and the second junctions may be called first and second unit junctions. Other first and second regions 41 and 42 used in a two-dimensional image pickup device may be named first and second additional semiconductor regions. Other first and second junctions may be called first and second additional junctions. In a photodiode, the second region 42 is unnecessary. In this event, the "first" semiconductor region 41 may be referred to as an interposed semiconductor region. The "first" junction may be called an elementary junction. The columns and rows of an image pickup device may be disposed either in oblique coordinates or in polar coordinates.

What is claimed is:

1. A solid-state photoelectric converter comprising: a semiconductor substrate of a first conductivity type; a first semiconductor region of a second conductivity type which is opposite to said first conductivity type formed on said semiconductor substrate, said first semiconductor region having a first portion forming a first PN-junction with said semiconductor substrate and having a first depth and a second portion forming a second PN-junction with said semiconductor substrate and having a second depth which is deeper than said first depth;

a plurality of second semiconductor regions of said first conductivity type formed in said first portion of said first semiconductor region, said second semiconductor regions being aligned in a line, and each of said second semiconductor regions accumulating charges therein in response to incident light;

means for transferring charges along said line of said second semiconductor regions, said transferring means being formed in said second portion of said first semiconductor region;

a charge transfer gate formed upon said first semiconductor region between said second semiconductor region and said transferring means for transferring charges accumulated in said second semiconductor regions to said transferring means;

means for converting charges transferred along said transferring means into an electrical signal; and means for reverse biasing said first and second PN-junctions to completely deplete said first portion up to said second semiconductor regions but to partly deplete said second portion.

2. A solid-state photoelectric converter as claimed in claim 1, wherein said impurity concentration of said first and second portion is between $10^{14}$ and $10^{16}$ atoms per cubic centimeter, the thickness of said first portion is between 0.5 and 20 microns, and the thickness of said second portion is between 1 and 100 microns.

3. A solid-state photoelectric converter as claimed in claim 1, wherein said transferring means is a semiconductor region of said first conductivity type.

4. A solid-state photoelectric converter as claimed in claim 3, further comprising a plurality of transfer electrodes formed upon said transferring means to form a buried channel charge-coupled device with said transferring means.

5. A solid-state photoelectric converter as claimed in claim 2, 3 or 4, further comprising at least another semiconductor region of said second conductivity type covering said second semiconductor regions and connected to said first semiconductor region.

6. A solid-state photoelectric converter as claimed in claim 5, wherein said other semiconductor region is connected to said first semiconductor region and has an impurity concentration between $10^{15}$ and $10^{20}$ atoms per cubic centimeter and a thickness between 0.1 and 5 microns.

7. A solid-state photoelectric converter comprising:
a semiconductor substrate of first conductivity type;
a semiconductor layer of second conductivity type which is opposite to said first conductivity type, said semiconductor layer being formed on said semiconductor substrate and having a plurality of first portions forming a first PN-junction with said semiconductor substrate and a plurality of second portions forming a second PN-junction with said semiconductor substrate, said second portions having a deeper depth than said first portions, and said first and second portions being formed alternately and in parallel with one another;

a plurality of photo-sensitive semiconductor regions of said first conductivity type formed in said first portions of said semiconductor layer, said photo-sensitive semiconductor regions being arranged in rows and columns so that each of said columns of said photo-sensitive semiconductor regions are formed in the same first portion, and each of said photo-sensitive semiconductor regions accumulating charges therein in response to incident light;

means formed in said second portions of said semiconductor layer for transferring charges;

means for controlling charges accumulated in said photo-sensitive semiconductor regions to be transferred to said transferring means;

means for converting a quantity of charges transferred along said charge transfer regions into an electrical signal; and means for reverse biasing said first and second PN-junctions to completely deplete said first portions but to partly deplete said second portions.

8. A solid-state photoelectric converter as claimed in claim 7, wherein said transferring means are semiconductor regions of said first conductivity type.

9. A solid-state photoelectric converter as claimed in claim 7, wherein said first and second portions of said semiconductor layer have impurity concentrations between $10^{14}$ and $10^{16}$ atoms per cubic centimeter, said first portions having a depth between 0.5 and 20 microns, and said second portions having a depth between 1 and 100 microns.

10. A solid-state photoelectric converter as claimed in claim 8, further comprising a plurality of transfer electrodes formed above said transferring means to form buried channel charge-coupled devices with said transferring means.

11. A solid-state photoelectric converter as claimed in claim 7, 8, 9, or 10, further comprising covering regions of said second conductivity type covering said photo-sensitive semiconductor regions and being connected to said semiconductor layer.

12. A solid-state photoelectric converter as claimed in claim 11, wherein said covering semiconductor regions have an impurity concentration between $10^{15}$ and $10^{20}$ atoms per cubic centimeter and a depth between 0.1 and 5 microns.

* * * * *